(12) United States Patent
Obara et al.

(10) Patent No.: US 7,439,648 B2
(45) Date of Patent: Oct. 21, 2008

(54) SURFACE ACOUSTIC WAVE DEVICE AND MANUFACTURING METHOD THEREFOR, AND COMMUNICATIONS EQUIPMENT

(75) Inventors: Ikuo Obara, Kyoto (JP); Daisuke Makibuchi, Kyoto (JP); Kunihiko Muraoka, Kyoto (JP); Kiyohiro Iioka, Kyoto (JP)

(73) Assignee: Kyocera Corporation, Kyoto (JP)

( * ) Notice: Subject to any disclaimer, the term of this patent is extended or adjusted under 35 U.S.C. 154(b) by 331 days.

(21) Appl. No.: 11/213,617

(22) Filed: Aug. 26, 2005

(65) Prior Publication Data

US 2006/0043823 A1 Mar. 2, 2006

(30) Foreign Application Priority Data

Aug. 27, 2004 (JP) .............................. 2004-249288

(51) Int. Cl.
*H01L 41/08* (2006.01)
(52) U.S. Cl. ................. 310/313 A; 310/313 R
(58) Field of Classification Search ............. 310/313 A, 310/313 R, 360
See application file for complete search history.

(56) References Cited

U.S. PATENT DOCUMENTS

| | | | | |
|---|---|---|---|---|
| 3,965,444 A | * | 6/1976 | Willingham et al. | ........ 333/155 |
| 4,243,960 A | * | 1/1981 | White et al. | ................. 333/196 |
| 4,342,012 A | * | 7/1982 | Inaba et al. | .................. 333/155 |
| 4,952,832 A | * | 8/1990 | Imai et al. | ................ 310/313 A |
| 4,978,879 A | * | 12/1990 | Satoh et al. | .............. 310/313 A |
| 5,325,573 A | | 7/1994 | Miyashita et al. | |
| 5,432,392 A | * | 7/1995 | Kadota et al. | ........... 310/313 A |
| 2004/0222273 A1 | | 11/2004 | Galambos et al. | |

FOREIGN PATENT DOCUMENTS

| | | |
|---|---|---|
| JP | 03-293808 | 12/1991 |
| JP | 06061774 A | 3/1994 |
| JP | 10-200363 | 7/1998 |
| JP | 2000-183680 | 6/2000 |
| JP | 2004-35396 | 2/2004 |
| WO | 03010888 A1 | 2/2003 |

OTHER PUBLICATIONS

Chinese language office action for corresponding Chinese application 2005100959743 lists the references above.

* cited by examiner

*Primary Examiner*—Mark Budd
(74) *Attorney, Agent, or Firm*—Hogan & Hartson LLP

(57) ABSTRACT

A surface acoustic wave device configured by forming an oxide layer 2 on a piezoelectric substrate 1 composed of a lithium tantalate single crystal or a lithium niobate single crystal and having weak pyroelectric properties having a lower oxygen content than a stoichiometric composition ratio, and forming thereon an IDT electrode 3. There is no static destruction of a minute electrode due to the pyroelectric effect of the piezoelectric substrate having weak pyroelectric properties, and frequency characteristics are not degraded.

17 Claims, 10 Drawing Sheets

SURFACE ACOUSTIC WAVE DEVICE AND MANUFACTURING METHOD THEREFOR, AND COMMUNICATIONS EQUIPMENT

BACKGROUND OF THE INVENTION

1. Field of the Invention

The present invention relates to a surface acoustic wave device having an IDT (Inter Digital Transducer) electrode and the like on a piezoelectric substrate. The surface acoustic wave device is used for a surface acoustic wave filter or the like in mobile communications equipment.

2. Description of Related Art

In recent years, a large number of surface acoustic wave devices have been used as constituent elements such as a filter, a delay line, and an oscillator in communications equipment. Particularly, a surface acoustic wave filter that is compact and lightweight and has a high steep cutoff performance as a filter has been frequently used as a filter particularly in an RF stage of a portable terminal device in a mobile communication field. A surface acoustic wave filter having a low loss, a wide bandwidth, and high out-of-band attenuation characteristics has been required.

Single crystals such as a lithium tantalate single crystal ($LiTaO_3$) and a lithium niobate single crystal ($LiNbO_3$) are generally used for a piezoelectric substrate for IDT electrode formation employed for a surface acoustic wave filter used for an RF stage such as a cellular phone. Since the single crystal materials have a higher electromechanical coupling coefficient than those of lithium tetraborate ($Li_2B_4O_7$) single crystal, a crystal substrate, and so forth, high attenuation characteristics can be obtained in a wide band.

The problem in a case where a surface acoustic wave device is manufactured on a piezoelectric substrate is that when the piezoelectric substrate is subjected to a rapid temperature change during manufacturing processing, polarization occurs in the piezoelectric substrate, so that charges are separated (called a pyroelectric effect).

Since the conductivity of the piezoelectric substrate is low, the stored charges cannot quickly leak out, so that a potential difference occurs between metalized regions (hereinafter referred to as "electrodes") adjacent to each other in the surface acoustic wave device. Particularly in the place where a space between electrode fingers of the IDT electrode is narrow, the charges are neutralized by ark discharges.

An electric field produced between the electrodes due to the stored charges mechanically damages the piezoelectric substrate even if no ark discharges are induced. According to examination using an electron microscope, it is confirmed that the piezoelectric substrate is cracked and destroyed at edges of the electrodes by the electric field, and the electrodes and probably the piezoelectric substrate are damaged by induction of ark discharges.

Such a damage changes the propagation of an acoustic wave or a surface acoustic wave into a undesirable state, thereby causing a failure or a reduction in performance of the surface acoustic wave device.

Furthermore, when rapid hysteresis of heat is given in manufacturing steps, a wafer serving as the piezoelectric substrate may adsorb a stage, a conveying jig, or the like in a manufacturing apparatus by generated pyroelectricity.

The piezoelectric substrate may be warped or cracked upon creation of a stress in the piezoelectric substrate. Dirt may adhere to a surface of the piezoelectric substrate by the generated pyroelectricity.

Therefore, devices on various processes have been conventionally proposed in order to prevent such discharge destruction.

A configuration in which a ground electrode of a surface acoustic wave device and an input/output electrode of an IDT electrode are connected to a dicing line has been proposed such that all conductor patterns on a piezoelectric substrate will be at the same potential (see JP, 03-293808(A), for example).

Furthermore, all electrode patterns serving as floating electrodes (electrodes that are not conducted to another conductor portion) are connected to a ground electrode using a high-resistance pattern so that static electricity generated by a pyroelectric effect is discharged to the ground without degrading frequency characteristics.

A specific example of the surface acoustic wave device is one in which a high-resistance pattern 9 composed of a high-resistance thin film formed by a silicon (Si) pattern into which impurities have been doped is connected to all electrode patterns serving as floating electrodes, to discharge static electricity to a ground electrode, as its electrode structure is illustrated in a plan view of FIG. 12 (see JP, 2000-183680(A), for example) In FIG. 12, reference numeral 8 denotes an IDT electrode and a reflector that constitute a surface acoustic wave resonator.

Still another example of the surface acoustic wave device is one using a finely folded pattern having a line width of approximately 1 μm (a meander line) as a high-resistance pattern 10 (see JP, 10-200363(A), for example), as its electrode structure is illustrated similarly in plan view of FIG. 13.

In a method of manufacturing a surface acoustic wave device shown in FIGS. 12 and 13, the step of forming an Si pattern 9 or a high-resistance pattern 10 is required, so that the manufacture thereof becomes complicated, and much time is required until the surface acoustic wave device is completed.

In recent years, a method of increasing a bulk conductivity by heating a lithium niobate single crystal in an atmosphere including reducing gas has been proposed.

Consequently, oxygen ions are discharged from a surface of a lithium niobate material by the reducing gas, so that excessive electrons are left to increase the bulk conductivity of the piezoelectric substrate. The bulk conductivity is increased so that storage of charges in manufacturing steps of the surface acoustic wave device is prevented (see JP, 2004-35396(A), for example). Such a piezoelectric substrate whose bulk conductivity is increased is referred to as a "piezoelectric substrate having weak pyroelectric properties".

In reduction treatment of the piezoelectric substrate, however, when the conductivity of the piezoelectric substrate is too much reduced because the oxygen ions on the surface of the piezoelectric substrate are too much discharged, the composition on the surface of the piezoelectric substrate greatly varies so that the SAW speed varies.

As a result, the piezoelectric characteristics of the piezoelectric substrate having weak pyroelectric properties are degraded, so that the propagation characteristics of the surface acoustic wave are affected. Therefore, frequency characteristics such as an insertion loss or a pass bandwidth of the surface acoustic wave device may, in some cases, be degraded, so that desired characteristics may not be obtained.

An object of the present invention is to provide a surface acoustic wave device manufactured without causing pyroelectric destruction of a minute electrode by a pyroelectric effect of a piezoelectric substrate, without degrading its frequency characteristics such as an insertion loss or a pass bandwidth, and simply, and a manufacturing method therefor.

SUMMARY OF THE INVENTION

A surface acoustic wave device configured by forming an IDT electrode on a piezoelectric substrate having weak pyroelectric properties composed of a lithium tantalate single crystal or a lithium niobate single crystal, wherein a layer having a higher oxygen content (referred to as an oxide layer) than the inside of the piezoelectric substrate is formed in a region, where the IDT electrode is formed, on a surface of the piezoelectric substrate, and the IDT electrode is formed on the oxide layer.

The oxide layer can be formed by annealing the piezoelectric substrate in an oxygen atmosphere before electrode deposition, that is, replenishing an oxygen deficiency region on a very shallow surface (e.g., several hundred nanometers to several micrometers in depth) of the piezoelectric substrate with oxygen in a short time period, for example. The reason for this is that distortion of a crystal lattice of the piezoelectric substrate is reduced when the IDT electrode is formed by supplying oxygen to a region where the IDT electrode is formed, thereby making it possible to prevent an increase in insertion loss as much as possible.

According to a surface acoustic wave device in the present invention, the conductivity on the surface of the piezoelectric substrate in the region where the IDT electrode is formed can be brought into a state where the conventional oxygen content is higher than that of a piezoelectric substrate having pyroelectric properties in a stoichiometric composition ratio (but is lower than the bulk conductivity of the piezoelectric substrate having weak pyroelectric properties) without degrading the piezoelectric characteristics of the piezoelectric substrate, so that non-uniformity of charges by intrinsic polarization of the piezoelectric substrate caused by temperature changes is improved. That is, the generated charges are moved on the surface of the piezoelectric substrate between the IDT electrodes, so that a potential difference between the IDT electrodes is instantaneously alleviated, so that storage of the charges in the IDT electrode itself is restrained. Therefore, the IDT electrode can be prevented from being destroyed due to static electricity generated by a pyroelectric effect.

Therefore, the necessity of the step of producing a structure for preventing the static destruction of the IDT electrode as in the conventional technique is eliminated, so that the manufacture is simplified. The wafer serving as the piezoelectric substrate is not charged by static electricity, so that the wafer does not adsorb a stage, a jig, or the like in the wafer, thereby significantly improving handling in the steps such as the step of judging whether the wafer is an acceptable or defective product.

It is desirable that the conductivity of the oxide layer is in a range from $1 \times 10^{-12}/\Omega cm$ to $1 \times 10^{-10}/\Omega cm$. The IDT electrode is formed on the oxide layer having the conductivity in this range, so that the conductivity of the piezoelectric substrate is higher than the conventional piezoelectric substrate having an oxygen content in a stoichiometric composition ratio, thereby making it possible to prevent discharge destruction of the IDT electrode caused by temperature changes in manufacturing steps. Moreover, the possibility that the piezoelectric characteristics of the piezoelectric substrate are degraded because the conductivity thereof is too high as in the piezoelectric substrate having weak pyroelectric properties is eliminated, thereby allowing the propagation loss of the surface acoustic wave to be reduced and therefore, allowing characteristics such as the insertion loss, the pass-bandwidth, or the like of the surface acoustic wave device to be kept excellent. Therefore, desired frequency characteristics of the surface acoustic wave device can be obtained, thereby making it possible to improve an acceptable product ratio in the manufacture.

The oxygen content of the piezoelectric substrate having weak pyroelectric properties may be lower than a stoichiometric composition ratio. The oxygen content satisfies $0<x<0.3$, for example, when the lithium tantalate single crystal is expressed by $LiTaO_{3-x}$, and the lithium niobate single crystal is expressed by $LiNbO_{3-x}$.

The piezoelectric substrate having weak pyroelectric properties may be a lithium tantalate single crystal or a lithium niobate single crystal to which a transition metal element is added. For example, the piezoelectric substrate contains 2 to 3 mass % of iron as the transition metal element.

Here, used as the piezoelectric substrate having weak pyroelectric properties is one having a charging voltage of less than 1 kV and more suitably less than 0.7 kV, as shown in FIG. 14.

FIG. 14 is a graph showing results obtained by measuring the generation rate of sparks generated in the IDT electrode produced under conditions of 0.5 μmL/S (both a line width and a space are 0.5 μm), showing the relationship between a charging voltage and a spark generation rate. In FIG. 14, a temperature (unit: ° C.) is used to enter the horizontal axis, and a charging voltage (unit: kV) of the piezoelectric substrate due to static electricity generated by a pyroelectric effect. A black circle and a characteristic curve represent the temperature characteristics of the charging voltage at which sparks are generated.

As shown in FIG. 14, the piezoelectric substrate having weak pyroelectric properties causes sparks to be hardly generated when the charging voltage of the piezoelectric substrate is less than 1 kV (the generation of sparks is nil when the charging voltage of the piezoelectric substrate is less than 0.7 kV).

This is caused by results in the case of an SAW filter having an electrode line width of 0.5 μmL/S that is the current main stream. It is considered that in an SAW filter having an electrode line width that is not more than 0.5 μmL/S, the charging voltage becomes lower than the lower-limit voltage at which sparks are generated.

On the other hand, FIG. 15 is a graph showing experimental values of changes in an amount of surface charging by temperature changes in a case where a substrate composed of an $LiTaO_3$ single crystal having an oxygen content in a stoichiometric composition ratio in the comparative example. This causes a temperature rise as well as a gradual rise in charging voltage. When the temperature exceeds 120° C., the absolute value of the charging voltage is a value of not less than −3 kV, which is sufficient to easily destroy a minute electrode.

Contrary to this, in the case of a piezoelectric substrate composed of a lithium tantalate single crystal that is subjected to reduction treatment in the present invention shown in FIG. 14, the charging voltage is less than −0.5 kV at a maximum.

The same results are also obtained in the case of a piezoelectric substrate composed of a lithium tantalate single crystal to which 2 to 3 mass % of Fe is added as a transition metal element.

A surface acoustic wave device according to the present invention is a surface acoustic wave device configured by forming an IDT electrode on a piezoelectric substrate having weak pyroelectric properties composed of a lithium tantalate single crystal or a lithium niobate single crystal, wherein the oxygen content on a surface of the piezoelectric substrate in a region between electrode fingers of the IDT electrode is higher than the oxygen content on a surface of the piezoelectric substrate in a region under the electrode fingers of the IDT electrode.

On the surface of the piezoelectric substrate having weak pyroelectric properties, the oxygen content in a portion that affects the excitation and the propagation of the surface acoustic wave is increased to recover the pyroelectric properties of the piezoelectric substrate, thereby allowing characteristics such as an insertion loss and a pass bandwidth of the surface acoustic wave device to be kept excellent while preventing discharge destruction of the IDT electrode.

A method of manufacturing a surface acoustic wave deice according to the present invention comprises the steps of forming an oxide layer on a surface of a piezoelectric substrate having weak pyroelectric properties composed of a lithium tantalate single crystal or a lithium niobate single crystal, and forming an IDT electrode on a surface of the oxide layer on the piezoelectric substrate.

After a region for forming the IDT electrode that is previously oxidized on the surface of the piezoelectric substrate having weak pyroelectric properties, the IDT electrode is formed on the surface of the oxide layer, thereby making it possible to realize a surface acoustic wave device having a reduced propagation loss of a surface acoustic wave and having a lower loss, as compared with those in a case where there is no oxide layer in a region where the IDT electrode is formed.

When the IDT electrode in the piezoelectric substrate is dry-etched, for example, a substrate portion that has been subjected to reduction treatment or a substrate portion to which a transition metal element is added is not exposed, leaving an oxide layer in one region of a surface where the IDT electrode is formed in the piezoelectric substrate by a micro-loading effect of dry etching.

A region having an oxygen content increased by being further oxidized can be formed after the IDT electrode is formed.

A method of manufacturing a surface acoustic wave deice according to the present invention comprises the steps of forming an IDT electrode on a surface of a piezoelectric substrate having weak pyroelectric properties composed of a lithium tantalate single crystal or a lithium niobate single crystal, and forming an oxide layer on the surface of the piezoelectric substrate having the IDT electrode formed thereon using the IDT electrode as a mask.

In this manufacturing method, the insertion loss and the pass bandwidth of the surface acoustic wave device are not degraded while preventing the discharge destruction of the IDT electrode. Further, the first oxidizing step is omitted, as compared with that in the manufacturing method, thereby making it possible to simplify manufacturing steps.

According to communications equipment in the present invention, desired filter characteristics of the surface acoustic wave device can be obtained with high reliability because it comprises at least one of a receiving circuit and a transmission circuit having the surface acoustic wave device having any of the configurations, so that the sensitivity thereof is significantly improved as the communications equipment, thereby making it possible to keep the reliability of the communications equipment The foregoing and other objects, features, aspects and advantages of the present invention will become more apparent from the following detailed description of the present invention when taken in conjunction with the accompanying drawings.

DETAILED DESCRIPTION OF PREFERRED EMBODIMENTS

<Surface Acoustic Wave Device>

Figure 1:
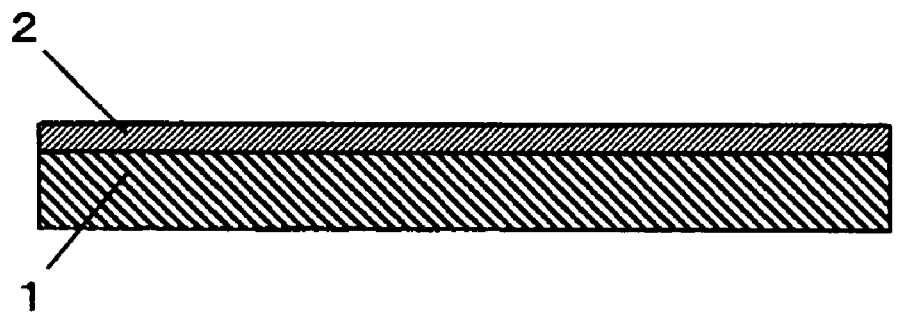
FIG. 1 is a cross-sectional view of a principal part showing how an oxide layer is formed by annealing on a surface of a piezoelectric substrate in a surface acoustic wave device according to the present invention.

FIG. 1 is a cross-sectional view of a piezoelectric substrate 1, showing a state where a layer having a high oxygen content (hereinafter referred to as an oxide layer) 2 is formed on a surface of the piezoelectric substrate 1 before an IDT electrode 3 is formed.

In FIG. 1, reference numeral 1 denotes a piezoelectric substrate having weak pyroelectric properties. The piezoelectric substrate 1 having weak pyroelectric properties is so adapted that an ordinary piezoelectric substrate composed of a lithium tantalate single crystal or a lithium niobate single crystal grown by a Czochralski method or the like is subjected to reduction treatment so that the oxygen content becomes lower than a stoichiometric composition ratio. The oxygen content of the piezoelectric substrate 1 having weak pyroelectric properties satisfies 0<x<0.3 when lithium tantalate is expressed by a chemical formula $LiTaO_{3-x}$ and lithium niobate is expressed by a chemical formula $LiNbO_{3-x}$.

Since the piezoelectric substrate 1 has weak pyroelectric properties, its charging voltage is less than 1 kV (more preferably less than 0.7 kV).

Figure 2:
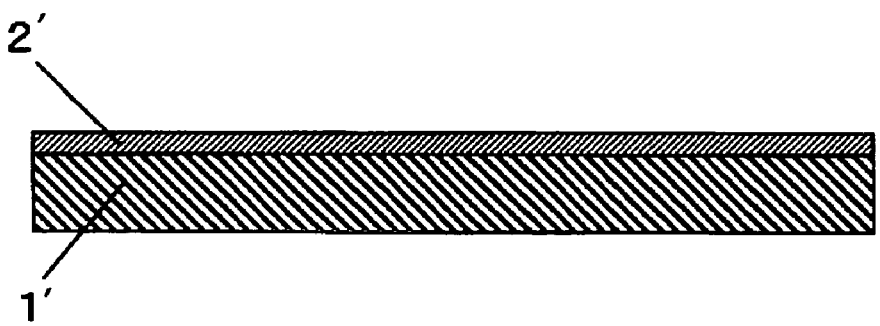
FIG. 2 is a cross-sectional view of a principal part showing how an oxide layer is formed on a surface of a piezoelectric substrate to which a transition metal element is added in the surface acoustic wave device according to the present invention.

FIG. 2 is a cross-sectional view of a principal part showing another example of a piezoelectric substrate in the surface acoustic wave device according to the present invention.

In FIG. 2, a piezoelectric substrate 1' is a lithium tantalate single crystal or a lithium niobate single crystal to which a transition metal element is added. An oxide layer 2' is formed on a surface of the piezoelectric substrate 1'.

The transition metal element (particularly, iron (Fe)) is contained in only small amounts (several mass percents) in a raw material, beginning at a crystal growing stage. The effect of enhancing a conductivity as in the case of the piezoelectric substrate 1 that has been subjected to reduction treatment is produced by distributing transition metal elements almost uniformly throughout a crystal of the piezoelectric substrate 1'.

The optimum value of the amount of addition differs depending on the type of transition metal element to be added. When the Fe element is selected as the transition metal element, for example, it is desirable that the Fe element is added to the lithium tantalate single crystal or the lithium niobate single crystal by approximately 1 mass %. The reason for this is that the magnitude of an insertion loss of the surface acoustic wave device depends on the mass of the transition metal element to be added, and the propagation loss of a surface acoustic wave is increased and is accompanied by an increase in the insertion loss in a heavier element. The reason why the transition metal element is used as an element to be added is that the conductivity thereof is higher, and the electron mobility thereof is higher, as compared with those of the other elements, so that the polarization of the piezoelectric substrate 1 is liable to be alleviated.

On a surface of the piezoelectric substrate 1 shown in FIG. 1 or FIG. 2, an oxide layer 2 having a high oxygen content is formed by annealing under conditions of a high-temperature/oxygen atmosphere. The thickness of the oxide layer 2 is several tens of nanometers, for example.

"x" of the oxide layer 2 is smaller than "x" of the piezoelectric substrate 1. However, "x" takes a value that is more than 0.

At this time, it is preferable that the conductivity of the oxide layer 2 is set in a range of $1\times10^{-12}/\Omega m$ to $1\times10^{-10}/\Omega cm$ by controlling an oxygen concentration, an annealing temperature, and an annealing treatment time. The reason why the conductivity in this range is preferable will be described later.

An IDT electrode 3 is then formed on the oxide layer 2 by a thin film forming method and photolithography.

Figure 3:
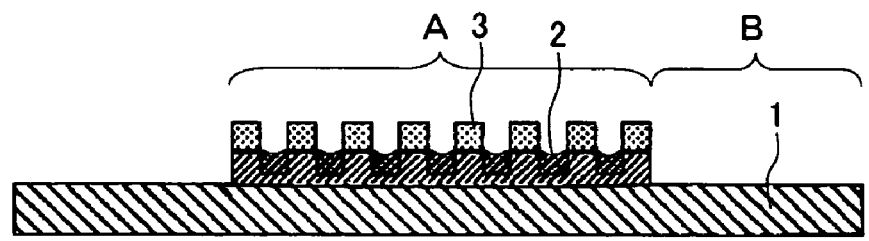
FIG. 3 is a cross-sectional view of a principal part showing an example of an embodiment of the surface acoustic wave device according to the present invention.

FIG. 3 illustrates a cross-sectional structure of a principal part where the IDT electrode 3 is formed on the piezoelectric substrate 1.

The IDT electrode 3 is formed by forming a metal film on the oxide layer 2 and removing a part of the formed metal film using a dry etching method.

When the metal film is removed at the time of the dry etching, the oxide layer 2 may be also etched and removed. In a region A of the piezoelectric substrate 1 where the IDT electrode 3 is formed, however, a difference appears in the removal speed of the oxide layer 2 by a micro-loading effect (an etching rate is low in the place where a gap between IDT electrodes is small so that the oxide layer 2 is difficult to etch), as compared with that in a region B of the piezoelectric substrate 1 where no IDT electrode 3 is formed. That is, in the region A where the IDT electrode 3 is formed, the etching rate of the oxide layer 2 is low, so that the oxide layer 2 remains without being etched, or the depth thereof is relatively small even if the oxide layer 2 is etched. On the other hand, in the region B where no IDT electrode 3 is formed, the oxide layer 2 is etched in its entirety, as shown in FIG. 3.

Consequently, in the region A where the IDT electrode 3 is formed, the oxide layer 2 remains not only in a lower part of the IDT electrode 3 but also between electrode fingers of the IDT electrode 3, so that the oxide layer 2 is substantially removed in the other region B, as shown in FIG. 3.

Figure 4:
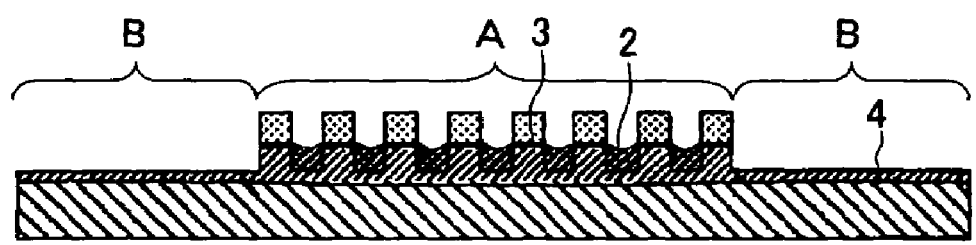
FIG. 4 is a cross-sectional view showing an example of a region where the oxygen content becomes high by being further oxidized after an IDT electrode is formed.

After the IDT electrode 3 is formed, a surface of the piezoelectric substrate 1 may be oxidized again. Consequently, an oxide layer 4 is further formed in an area between the electrode fingers of the IDT electrode 3, as shown in FIG. 4.

In certain areas of the oxide layers 2 and 4, a predetermined amount of static electricity is generated without degrading the piezoelectric characteristics of the piezoelectric substrate 1. Further, in the certain region of the oxide layer 2, x>0, as described above. Therefore, the conductivity on the surface of the piezoelectric substrate 1 between the electrode fingers of the IDT electrode 3 can be brought into a state where the conventional oxygen content is kept higher than that of the piezoelectric substrate 1 having pyroelectric properties in a stoichiometric composition ratio. In this region, a crystal lattice is hardly distorted. Further, in this region, the loss of a surface acoustic wave due to oxygen deficiency can be prevented.

Figure 5:
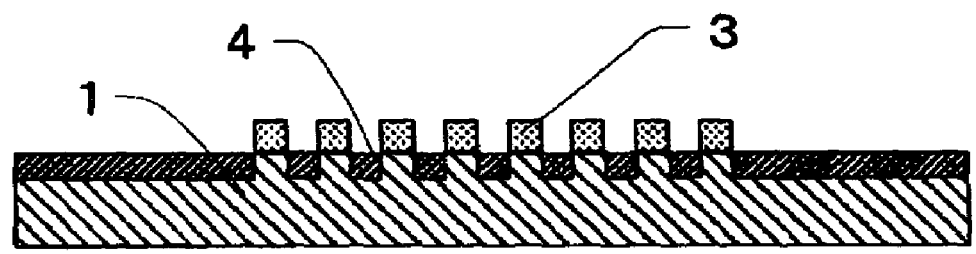
FIG. 5 is a cross-sectional view of a principal part showing another example of the embodiment of the surface acoustic wave device according to the present invention.

FIG. 5 is a cross-sectional view of a principal part showing another example of the embodiment of the surface acoustic wave device according to the present invention.

In the present embodiment, the first oxidation treatment of the piezoelectric substrate 1 is omitted, to form the IDT electrode 3 on the surface of the piezoelectric substrate 1, and then perform annealing treatment under conditions of high-temperature/oxygen atmosphere, to form a region 4 having a high oxygen content between the electrode fingers of the IDT electrode 3 on the surface of the piezoelectric substrate 1 using the IDT electrode 3 as a mask and in a region where no IDT electrode 3 is formed. The first oxidation treatment is omitted so that there is no oxide layer 2, as compared with that in the surface acoustic wave device shown in FIG. 3.

As described in the foregoing, according to the surface acoustic wave device in the present invention shown in FIG. 5, the IDT electrode 3 is formed on the piezoelectric substrate 1 having weak pyroelectric properties so that the oxygen content at least on the surface of the piezoelectric substrate 1 between the electrode fingers of the IDT electrode 3 is higher than that on a region under the electrode fingers of the IDT electrode 3. Consequently, the piezoelectric characteristics of the piezoelectric substrate 1 are not degraded.

Here, description is made of the reason why in the surface acoustic wave device according to the present invention, the piezoelectric substrate 1 is composed of a lithium tantalate single crystal or a lithium niobate single crystal, and the conductivity of the oxide layer 2 is suitable in a range of $1\times10^{-12}/\Omega cm$ to $1\times10^{-10}/\Omega cm$.

Figure 6:
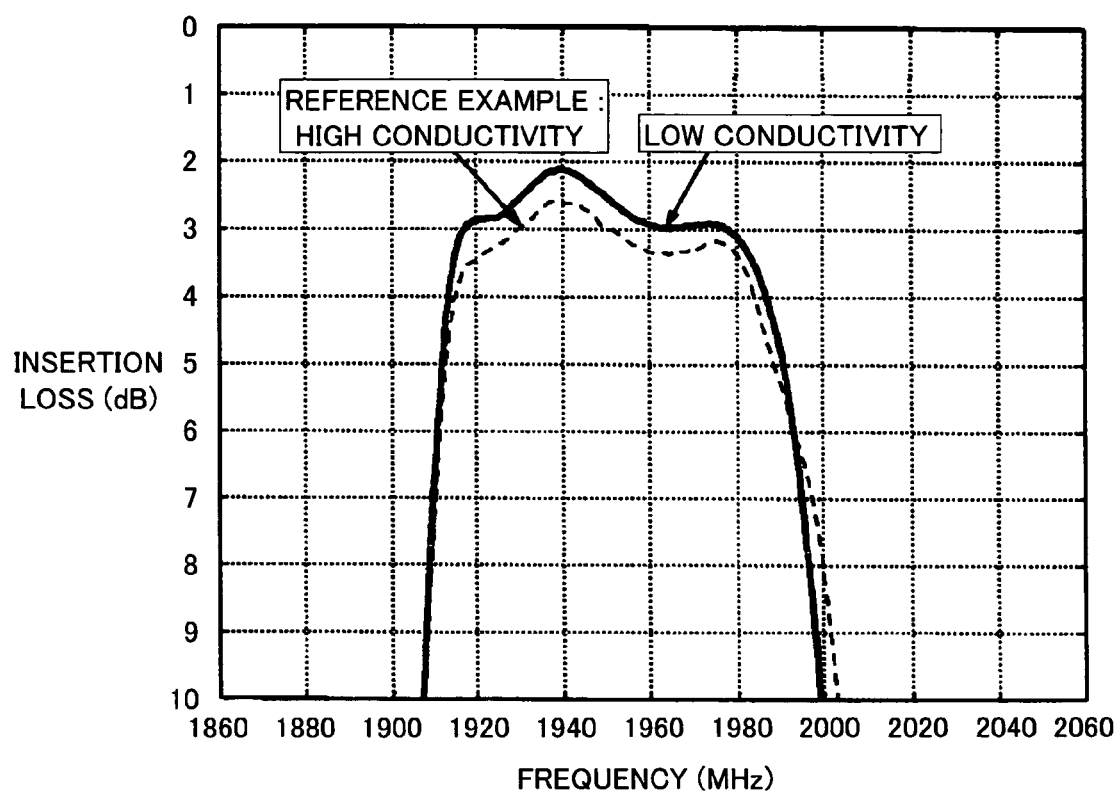
FIG. 6 is a graph showing frequency dependence of insertion losses in a pass band of a surface acoustic wave device and its vicinity.

FIG. 6 is a graph showing frequency dependence of transmission characteristics (insertion losses) in the vicinity of a pass band with respect to a surface acoustic wave device comprising a piezoelectric substrate 1 having a conductivity of $1\times10^{-11}/\Omega cm$ and a surface acoustic wave device in a reference example comprising a piezoelectric substrate 1 having a conductivity of $1\times10^{-8}/\Omega$cm, which are composed of a lithium tantalate single crystal and are produced in the same steps.

In FIG. 6, a frequency (unit: MHz) is used to enter the horizontal axis, and an insertion loss (unit: dB) is used to enter the vertical axis. The transmission characteristics of the surface acoustic wave device comprising the piezoelectric substrate 1 having a low conductivity is indicated by a solid line, and the transmission characteristics of the surface acoustic wave device in the reference example comprising the piezoelectric substrate 1 having a high conductivity is indicated by a broken line.

As can be seen from results shown in FIG. 6, in the surface acoustic wave device in the reference example indicated by the broken line, the sharpness degree of the transmission characteristics in the pass band is degraded, and shoulder characteristics on the high-frequency side is particularly degraded, as compared with those in the surface acoustic wave device indicated by the solid line. In the surface acoustic wave device in the reference example, therefore, the pass bandwidth is narrowed, and the insertion loss is also degraded.

It is considered that this is because charges are not easily stored on the surface of the piezoelectric substrate 1 when the oxygen content of the piezoelectric substrate 1 is reduced to increase the conductivity of the piezoelectric substrate 1, as in the reference example and consequently, the tangent tan δ of the piezoelectric substrate 1 is liable to increase so that a Q value (an amount representing the sharpness of resonance) is liable to decrease, so that the pass bandwidth is narrowed and the insertion loss is degraded.

Figure 7:
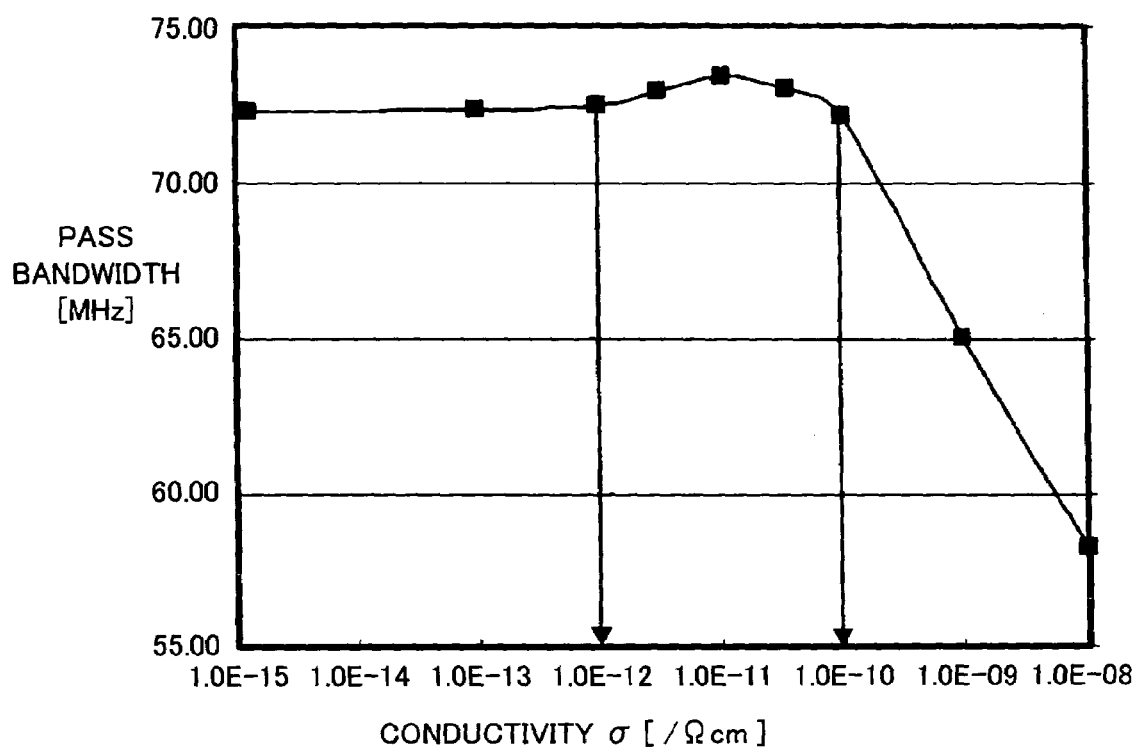
FIG. 7 is a characteristic view showing the pass-band characteristics of a surface acoustic wave device.
Figure 8:
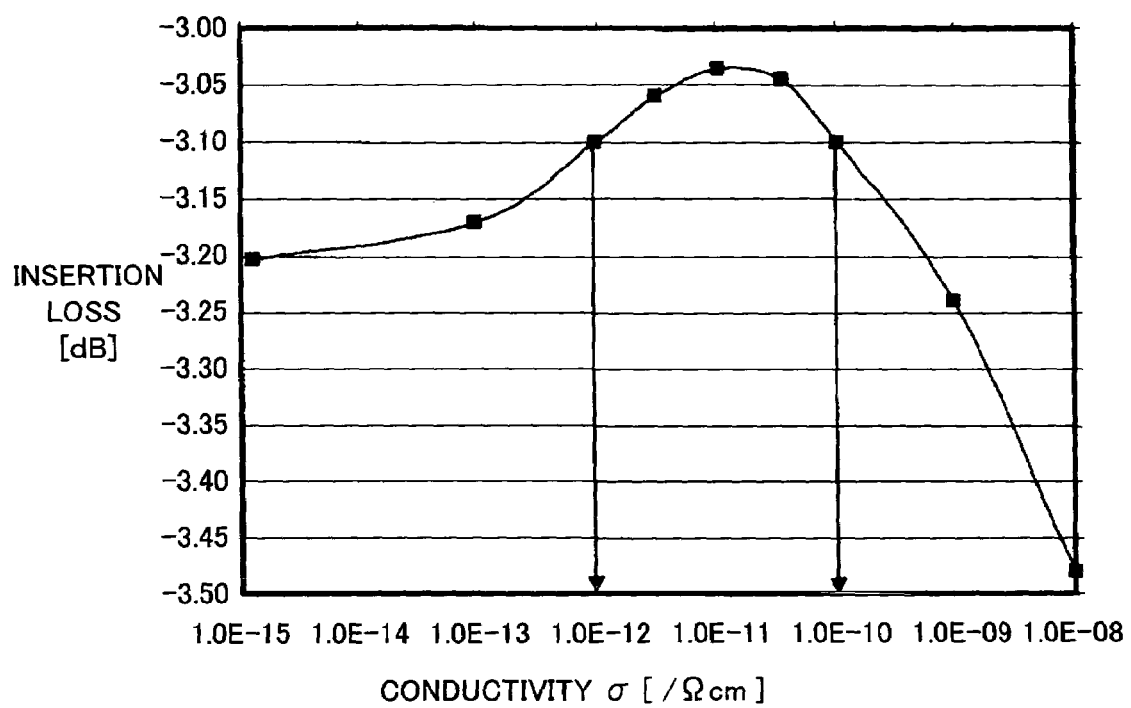
FIG. 8 is a characteristic view showing the minimum insertion loss characteristics of a surface acoustic wave device.

Here, the relationships between the conductivity of the piezoelectric substrate 1 and the pass bandwidth and the insertion loss of the surface acoustic wave device are respectively shown in FIGS. 7 and 8.

Generally, in a case where the surface acoustic wave device is used for communication in a PCB (Personal communication service; a 1.9 GHz band) system, it is desirable that the pass bandwidth is not less than 72 MHz, considering changes in frequency temperature characteristics and variations in characteristics, for example. Further, it is desirable that the value of the insertion loss is not more than 3.1 dB.

FIG. 7 is a graph of dependence of the pass bandwidth of the surface acoustic wave device on the conductivity of the piezoelectric substrate 1. In FIG. 7, a conductivity σ (unit: /Ωm) of the piezoelectric substrate 1 is used to enter the horizontal axis, and a pass bandwidth (unit: MHz) is used to enter the vertical axis. A black square and a characteristic curve represent the results of the conductivity dependence of the pass bandwidth.

FIG. 8 is a similar graph showing dependence of the insertion loss of the surface acoustic wave device on the conductivity of the piezoelectric substrate 1. In FIG. 8, a conductivity ó (unit: /Ωcm) of the piezoelectric substrate 1 is used to enter the horizontal axis, and an insertion loss (unit: dB) is used to enter the vertical axis. A black square and a characteristic curve represent the results of the conductivity dependence of the insertion loss.

As can be seen from results shown in FIG. 7, a range in which the pass bandwidth is not less than 72 MHz is a range in which the conductivity of the piezoelectric substrate 1 is not more than $1\times10^{-10}/\Omega$cm, and more preferably from $1\times10^{-12}/\Omega$cm to $1\times10^{10}/\Omega$cm.

As can be seen from FIG. 8, a range in which the insertion loss is not significantly degraded is a range in which the conductivity of the piezoelectric substrate 1 is not more than $1\times10^{-10}/\Omega$cm, and more preferably a range in which the insertion loss is not more than 3.1 dB is a range from $1\times10^{-12}/\Omega$cm to $1\times10^{-10}/\Omega$cm.

From the foregoing, it is preferable that the conductivity of the piezoelectric substrate 1 is in a range from $1\times10^{-12}/\Omega$cm to $1\times10^{10}/\Omega$cm.

Consequently, a surface acoustic wave filter in which the tangent tans of the piezoelectric substrate 1 decreases, a Q value increases, the bandwidth is a sufficient pass bandwidth of not less than 72 MHz required for communication of a PCS system, and the insertion loss can be sufficiently reduced to not more than 3.1 dB required for the PCS system is realized.

<Method of Manufacturing Surface Acoustic Wave Device>

Figure 9:
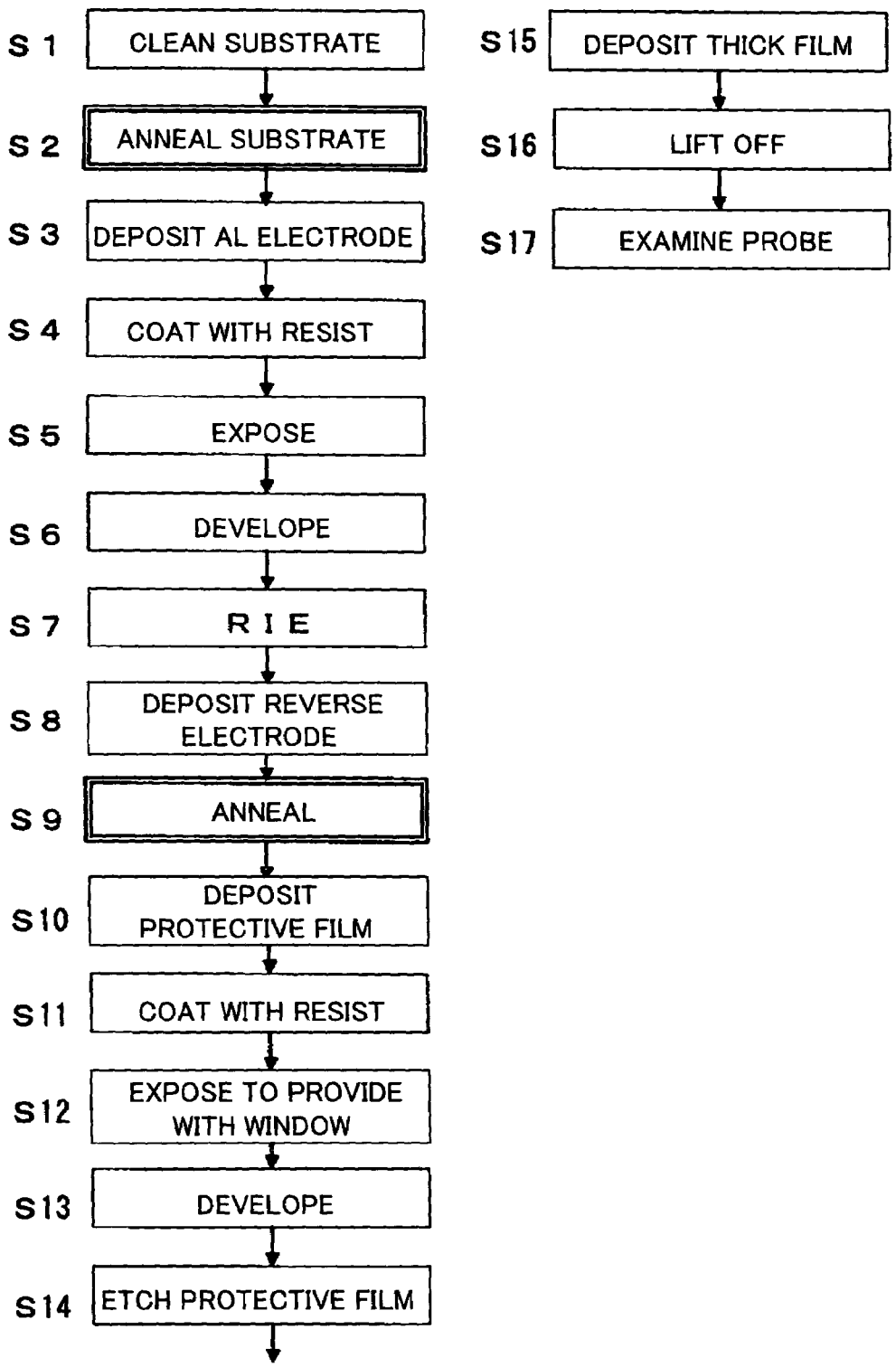
FIG. 9 is a flow chart for explaining an example of the steps of a method of manufacturing the surface acoustic wave device according to the present invention.

An embodiment of a method of manufacturing the surface acoustic wave device according to the present invention will be then described using a flow chart showing manufacturing steps shown in FIG. 9.

Here, description is made by taking as an example the surface acoustic wave device shown in FIG. 4.

A wafer serving as a piezoelectric substrate 1 composed of a normal lithium tantalate single crystal or lithium niobate single crystal is subjected to reduction treatment, thereby manufacturing a piezoelectric substrate 1 having weak pyroelectric properties having a smaller oxygen content than a stoichiometric composition ratio. An amount of intrinsic polarization of the piezoelectric substrate 1 can be reduced by subjecting the piezoelectric substrate 1 to annealing (heating treatment) in a hydrogen atmosphere, for example, to bring a surface of the piezoelectric substrate 1 into oxygen deficiency.

The amount of intrinsic polarization can be uniformly reduced throughout the thickness direction of the wafer serving as the piezoelectric substrate 1 by performing the annealing for a long time period. Consequently, the generation of sparks due to temperature changes caused by a pyroelectric effect can be nil.

As shown in FIG. 9, a wafer composed of a lithium tantalate single crystal having weak pyroelectric properties is first cleaned by an organic solvent, and is subsequently dried using a spin-driver (step S1).

The wafer is then annealed for a short time period in an oxygen annealing furnace, to oxidize one region on the surface of the piezoelectric substrate 1 having weak pyroelectric properties (a surface layer portion of a region required for forming an IDT electrode 3) and form an oxide layer 2 (step S2).

An Al—Cu alloy is then deposited on the wafer by a sputtering device (step S3).

The Al—Cu alloy is then coated with a photoresist in an uniform thickness using a spin-coater (step S4).

Ultraviolet rays that have been transmitted by a reticle using a reduced projection exposure machine are exposed to a surface of the photoresist on the wafer to bake a pattern of the reticle (step S5).

A developing solution is dropped on the wafer after the exposure and is shaken off after standing still for several seconds to develop the wafer, to express a desired pattern (step S6).

A surface of the wafer is then subjected to plasma processing by reactive gas using an RIE (Reactive Ion Etching) device, to etch away only an Al—Cu alloy in a portion that is not covered with the photoresist to form an Al—Cu electrode as well as to dry-etch away a surface of the oxide layer 2 excluding a region, where the IDT electrode 3 is formed, of the piezoelectric substrate 1 (step S7).

An Al—Cu conductor layer is then deposited over the entire reverse surface of the wafer by sputtering (step S8).

The wafer is then annealed for a short time period in an oxygen annealing furnace again, to oxidize a region between the electrode fingers of the IDT electrode 3 on the surface of the piezoelectric substrate 1 having weak pyroelectric properties again (step S9). This makes it possible to form, after the oxide layer 2 is previously formed on the surface of the piezoelectric substrate 1 having weak pyroelectric properties, an oxide layer 4 having a high oxygen content by being further oxidized in a portion between the electrode fingers of the IDT electrode 3 that affects excitation of the surface acoustic wave. Consequently, an oxygen deficiency region on the surface of the piezoelectric substrate 1 can be replenished with oxygen, piezoelectric properties on the surface of the piezoelectric substrate 1 are not degraded, and the propagation loss of the surface acoustic wave is reduced. This makes it possible to realize a surface acoustic wave device having a lower loss, as compared with that in a case where there is no oxide layer in a region where the IDT electrode 3 is formed. Further, the conductivity on the surface of the piezoelectric substrate 1 between the IDT electrodes 3 can be kept higher than that of the conventional piezoelectric substrate 1 having pyroelectric properties, so that non-uniformity of charges by intrinsic polarization of the piezoelectric substrate 1 caused by temperature changes in the manufacturing steps is improved, and generated charges are moved on the surface of the piezoelectric substrate 1 between the IDT electrode 3. Therefore, a potential difference between the IDT electrodes 3 is instantaneously reduced, so that charges are prevented from being stored in the IDT electrode 3 itself, thereby making it possible to prevent the destruction of the IDT electrode 3 due to static electricity generated by a pyroelectric effect.

At this time, hysteresis of heat is generated by annealing processing. However, an Al—Cu conductor layer is formed over the entire reverse surface of the wafer. Even if the wafer has pyroelectric properties, therefore, the Al—Cu electrode is not destroyed.

A protective film (an $SiO_2$ film) is then deposited on a surface of the Al—Cu electrode on the surface of the wafer by a CVD device (step S10)

The protective film is then coated with a photoresist in a uniform thickness using a spin-coater in order to provide the protective film with a window (step S11).

In order to provide the protective film with a window, ultraviolet rays that have been transmitted by the reticle are exposed to the surface of the wafer using the reduced projection exposure machine, to bake a pattern of the reticle (step S12).

A developing solution is then dropped on the wafer after the exposure and is shaken off after standing still for several seconds, to express a desired pattern (step S13).

An unnecessary $SiO_2$ protective film expressed by a pattern of the photoresist is then etched away using the RIE device (step S14).

A thick film of a conductor for connection with a package is deposited in a portion from which the $SiO_2$ protective film is removed (step S15).

The wafer is then dipped into a stripping solution of the photoresist, to remove the unnecessary thick film together with the photoresist (step S16).

An RF probe is then raised on the completed surface acoustic wave device, to perform property selection examination (step S17)

In the manufacturing steps of the surface acoustic wave device according to the present invention, therefore, an annealing process of the piezoelectric substrate 1 (wafer) in the step S2 is required. However, the step of producing high-resistance patterns 9 and 10 that have been conventionally required can be omitted, thereby making it possible to manufacture a surface acoustic wave device significantly simply.

A large number of surface acoustic wave devices at a wafer level manufactured as described above are separated into individual surface acoustic wave devices by a dicing process, thereby obtaining the surface acoustic wave device according to the present invention.

Figure 11:
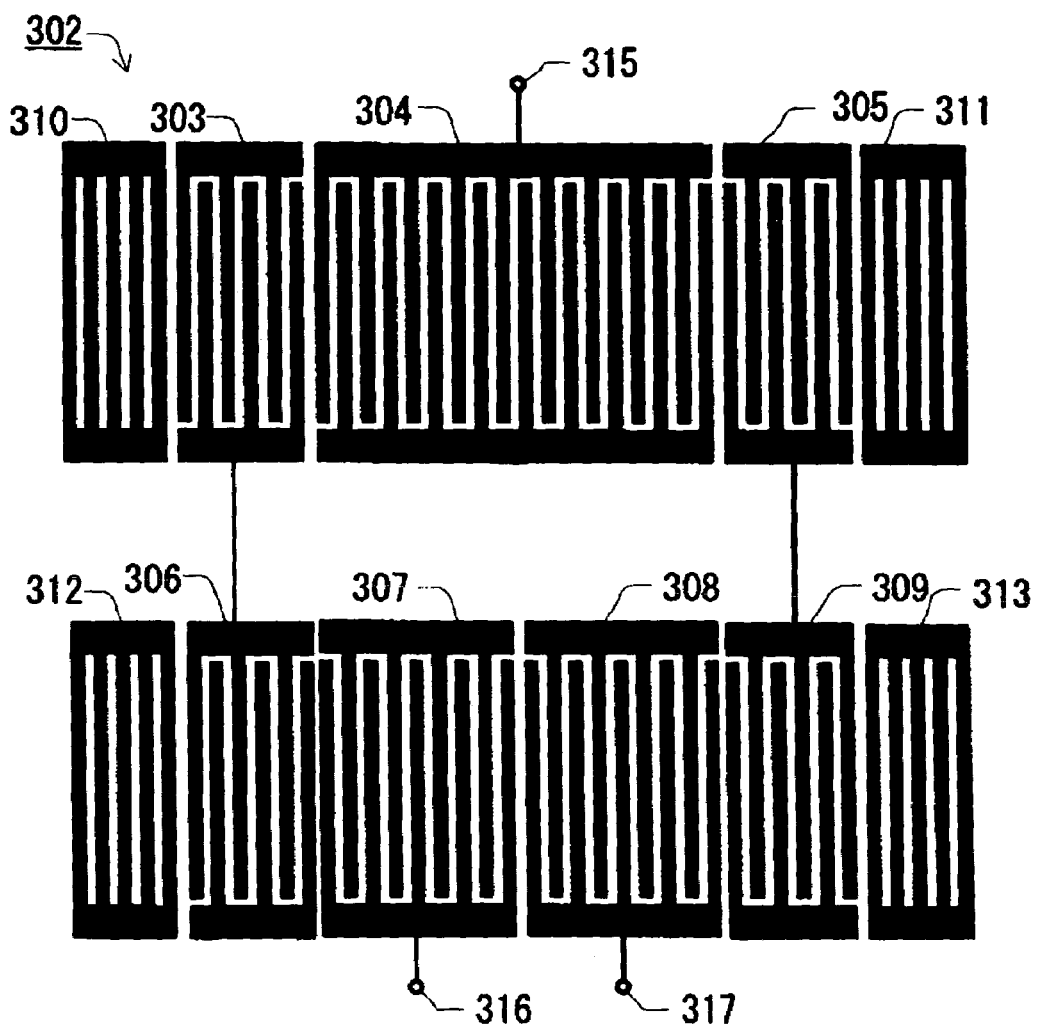
FIG. 11 is a plan view for explaining an example of an electrode structure of the surface acoustic wave device according to the present invention.

An example of an electrode structure of the surface acoustic wave device according to the present invention thus obtained is shown in FIG. 11, for example.

An IDT electrode 304 having a plurality of electrode fingers disposed on the piezoelectric substrate 302 is composed of a pair of comb-shaped electrodes opposed to and meshed with each other. An electric field is applied to the pair of comb-shaped electrodes, to produce a surface acoustic wave.

An electric signal is inputted from an input terminal 315 connected to one of the comb-shaped electrodes in the IDT electrode 304, so that the excited surface acoustic wave is propagated to IDT electrodes 303 and 305 arranged on both sides of the IDT electrode 304.

An electric signal is outputted to output terminals 316 and 317 through IDT electrodes 306 and 309 from respective ones of the comb-shaped electrodes composing the IDT electrodes 303 and 305.

In the drawing, reference numerals 310, 311, 312, and 313 respectively denote reflector electrodes.

The surface acoustic wave device according to the present invention can be a surface acoustic wave device in a so-called vertically coupled resonator-type surface acoustic wave filter in which electrode patterns are connected in a two-stage cascaded manner.

It goes without saying that the surface acoustic wave device according to the present invention is not limited to a vertically coupled resonator-type surface acoustic wave filter, but is also applicable to a ladder-type surface acoustic wave filter or the like, for example.

A method of manufacturing the surface acoustic wave device in the present invention, as described above, comprises the step (S2) of oxidizing a surface of a piezoelectric substrate 1 having weak pyroelectric properties composed of a lithium tantalate single crystal or a lithium niobate single crystal and having an oxygen content lower than a stoichiometric composition ratio, the steps (S3 to S6) of then forming an IDT electrode 3 on an oxidized surface of the piezoelectric substrate 1, the step (S7) of then removing the oxidized surface, excluding a region, on which the IDT electrode 3 is formed, of the piezoelectric substrate 1, and the step (S9) of further oxidizing the oxidized surface between electrode fingers of the IDT electrode 3 in the piezoelectric substrate 1.

In the step of oxidizing the surface of the piezoelectric substrate 1 and the step of further oxidizing the oxidized surface between the electrode fingers of the IDT electrode 3 in the piezoelectric substrate 1, an oxygen concentration, an annealing temperature, and an annealing treatment time are controlled, thereby making it possible to carry out control such that the conductivity on the surface of the piezoelectric substrate 1 is not too high and not to degrade the piezoelectric characteristics of the piezoelectric substrate 1. As a result, there can be provided a surface acoustic wave device in which the insertion loss and the pass bandwidth of a filter are not degraded.

Furthermore, in comb-shaped electrode portions composing the IDT electrode 3, an etching rate in a minute electrode portions is low by a micro-loading effect in etching, for example, so that a substrate portion that has been subjected to reduction treatment or a substrate portion to which a transition metal element has been added are not exposed, leaving an oxide layer 2 on the surface of the piezoelectric substrate 1 (see FIG. 3). Therefore, the degradation of the propagation loss of the surface acoustic wave is reduced, thereby making it possible to realize a surface acoustic wave deice having a lower loss than that in a case where there is no oxide layer.

In the foregoing example of the embodiment of the method of manufacturing the surface acoustic wave device according to the present invention, description is made of the manufacturing steps for forming the IDT electrode 3 after oxidizing at least one region of the surface of the piezoelectric substrate 1 (wafer), the present invention is not limited to the above-mentioned embodiment.

The present invention can be suitably changed departing from the scope of the present invention. For example, the IDT electrode 3 may be formed in a region of the oxide layer 2 that has remained after first oxidizing the surface of the piezoelectric substrate 1, and then etching away only the periphery thereof. Alternatively, only a portion where the IDT electrode 3 is formed may be oxidized or the periphery thereof may be subjected to reduction treatment after the IDT electrode 3 is previously produced.

Figure 10:
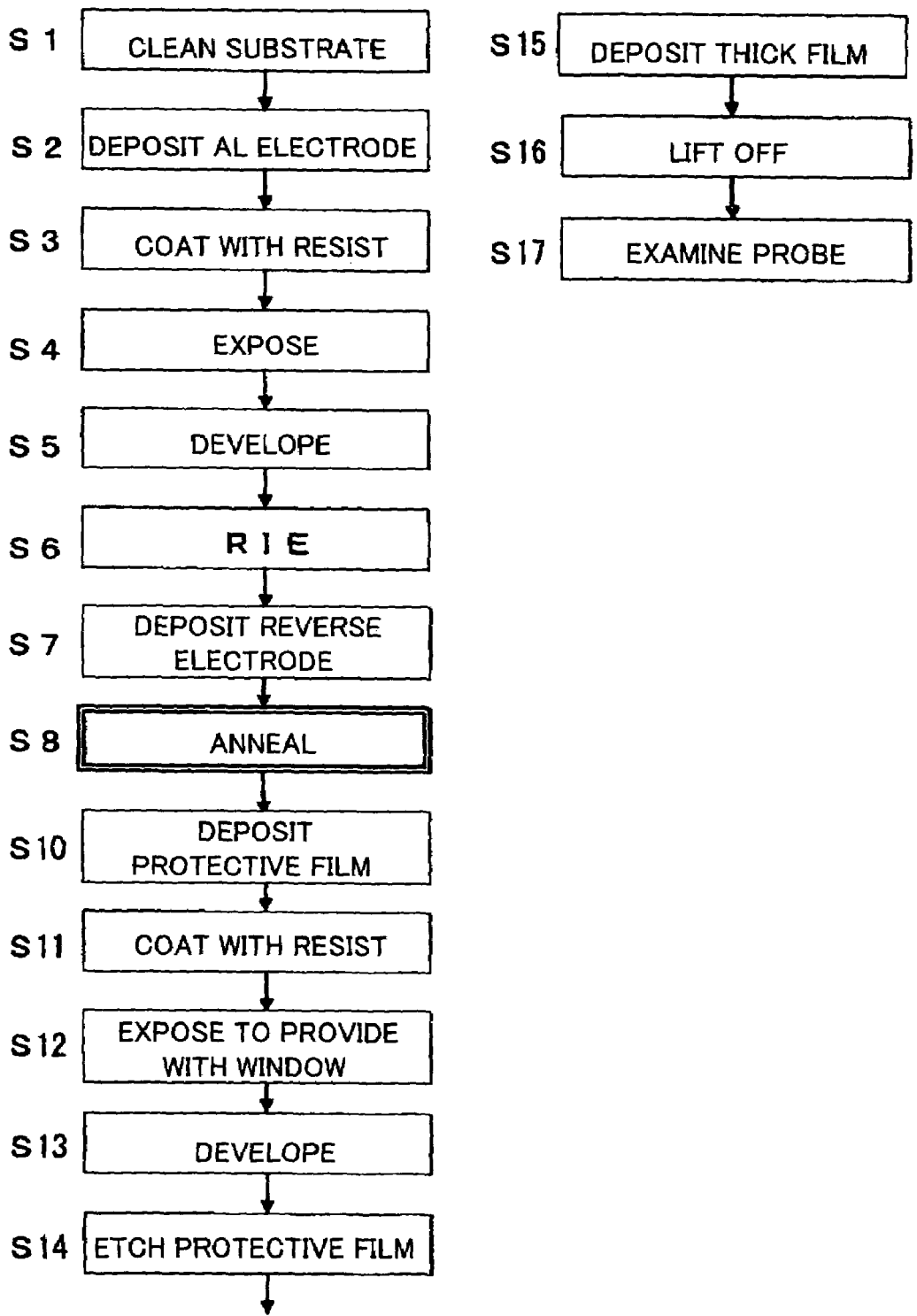
FIG. 10 is a flow chart for explaining another example of the steps of a method of manufacturing the surface acoustic wave device according to the present invention.

Another example of the embodiment of the method of manufacturing the surface acoustic wave device according to the present invention is shown in a flow chart of FIG. 10.

Here, description is made by taking as an example the steps of manufacturing the surface acoustic wave device shown in FIG. 5.

The manufacturing method comprises the steps (steps S2 to S6) of forming an IDT electrode 3 in a lithium tantalate single crystal piezoelectric substrate 1 or a lithium niobate single crystal piezoelectric substrate 1 having weak pyroelectric properties whose oxygen content is lower than a stoichiometric composition ratio and the step (step S8) of oxidizing the surface of the piezoelectric substrate 1 using the formed IDT electrode 3 as a mask, thereby making it possible to manufacture a surface acoustic wave device the insertion loss and the pass bandwidth of which are not degraded while preventing the discharge destruction of the IDT electrode 3, as in the example shown in FIG. 9.

Furthermore, the first annealing process (the step S2 shown in FIG. 9) is omitted, thereby making it possible to simplify the manufacturing steps.

<Communications Equipment>

The surface acoustic wave device according to the present invention is used as a transmitting or receiving band-pass filter included in a receiving circuit or a transmission circuit in communications equipment, for example.

For example, the present invention can be used for communications equipment comprising a transmission circuit capable of attenuating an unnecessary signal by a transmitting band-pass filter composed of transmitting IDT electrodes with a transmission signal outputted from a transmission circuit on a carrier frequency using a mixer and then, amplifying the transmission signal using a power amplifier, to transmit the transmission signal from an antenna through a duplexer.

Furthermore, the present invention is applicable to communications equipment comprising a receiving circuit for receiving a receiving signal using an antenna, amplifying the receiving signal that has passed through a duplexer using a low-noise amplifier, then attenuating an unnecessary signal using a receiving band-pass filter composed of receiving IDT electrodes, separating the signal from a carrier frequency using a mixer, and transmitting the signal to the receiving circuit for extracting the signal.

The present invention can provide superior communications equipment having improved sensitivity by comprising the surface acoustic wave device according to the present invention in the receiving circuit or the transmission circuit.

The communications equipment can obtain desired filter characteristics of the surface acoustic wave device with high reliability, so that the sensitivity of the communications equipment is significantly improved, thereby making it possible to keep the reliability of the communications equipment high.

In order to sufficiently exhibit an effect produced by the surface acoustic wave device according to the present invention in the communications equipment according to the present invention, it is preferable that both a receiving circuit and a transmission circuit comprise the surface acoustic wave device according to the present invention. This makes it possible to sufficiently reduce both respective unnecessary signals of the receiving signal and the transmission signal, to allow communication quality to be improved, so that a receiving filter and a transmission filter can be small-sized filters. Therefore, the communications equipment according to the present invention can be small-sized and high-quality communications equipment.

EXAMPLE

The surface acoustic wave device according to the present invention will be then described with respect to more specific examples.

In order to subject a wafer, composed of a 36-degree Y-cut lithium tantalate single crystal, serving as a piezoelectric substrate 1 to reduction treatment, the wafer was subjected to annealing treatment for ten or more hours at 300° C. in a hydrogen annealing furnace. A hydrogen flow rate was 80 sccm, and a gas pressure was $7.5 \times 10^{-3}$ Torr. The wafer that has been treated under the conditions was almost uniformly subjected to reduction treatment throughout the thickness direction of the wafer.

The wafer was annealed for ten minutes under the same conditions as the hydrogen annealing in an oxygen annealing furnace, to form an oxide layer 2 having a thickness of 200 to 300 Å (angstrom) on a surface of the wafer.

An electrode layer composed of an Al (98 mass %)—Cu (2 mass %) alloy was then deposited on the wafer using a DC sputtering device.

The wafer was then spin-coated with photoresist in a thickness of approximately 0.5 μm, to expose a desired portion using a reduced projection exposure device (a stepper).

The photoresist in an unnecessary portion was dissolved using an alkali developing solution in a developing device, to express a desired resist pattern. The minimum line width of the resist pattern was approximately 0.5 μm.

A portion to which an electrode is exposed was then dry-etched by an RIE (Reactive Ion Etching) device, and the electrode was patterned, to form an IDT electrode 3 in one region on a surface of the wafer. In the case, in a minute electrode portion of the IDT electrode 3, etching does not easily progress because reactive gas is not easily replaced by a micro-loading effect. However, an electrode portion other than the minute electrode portion is excessively etched because etching relatively progresses so that the oxide layer 2 on the surface of the wafer was cut.

Annealing treatment was performed under an oxygen atmosphere for ten minutes under the same conditions as the conditions previously described, to further form the oxide layer 4 on the surface of the wafer.

An SiO$_2$ protective film was then deposited on the wafer by a CVD (Chemical Vapor Deposition) device, and an electrode pad section was then patterned on the SiO$_2$ protective film by photolithography again, to etch an unnecessary SiO$_2$ film in the electrode pad portion for bonding using a bump by the RIE device.

From its upper part, a thick film (a thickness of not less than 1 μm) of Al or the like was then formed by a sputtering method. Thereafter, an unnecessary portion, together with the photoresist, was dissolved and stripped by a resist stripping solution.

Finally, a wafer process was terminated after inspecting a product for defects (an acceptable/defective product) by wafer probe inspection.

By using a wafer serving as the surface acoustic wave device according to the present invention, the wafer takes on a black color. In the manufacturing apparatuses during the steps (e.g., in a pre-alignment of a wafer prober (for recognizing whether or not there is a wafer), therefore, the conventional piezoelectric substrate 1 is a transparent substrate. Therefore, a wafer recognition rate can be improved from approximately 0% to approximately 100%. When the conventional piezoelectric substrate 1 that is a transparent substrate is employed, special adjustment was required for wafer recognition.

An Au bump was then formed on the piezoelectric substrate 1 by a bump bonder.

Thereafter, the piezoelectric substrate 1 was cut along a dicing line, and was divided for each surface acoustic wave device.

The surface acoustic wave device that has been divided into pieces by dicing was picked up using a die-mounter, and was bonded and fixed within an SMD (Surface-Mounted Device) package at a temperature of approximately 150° C.

Thereafter, the SMD package was covered with a lid, and was welded and sealed in a sealing machine, to complete the surface acoustic wave device.

In this case, in a conventional surface acoustic wave device using a lithium tantalate single crystal substrate, discharge destruction occurs by making a rapid temperature change at approximately 150° C., so that approximately 90% thereof was defective.

However, the piezoelectric substrate 1 serving as the surface acoustic wave device according to the present invention was employed so that the defectiveness due to the discharge destruction was nil.

In the present embodiment, a vertically coupled resonator-type surface acoustic wave filter was produced using the surface acoustic wave device according to the present invention having an electrode structure shown in FIG. 11.

Furthermore, as a comparative example, a comparative example of the vertically coupled resonator-type surface acoustic wave filter was also produced in a conventional manufacturing method using a conventional piezoelectric substrate.

Figure 12:
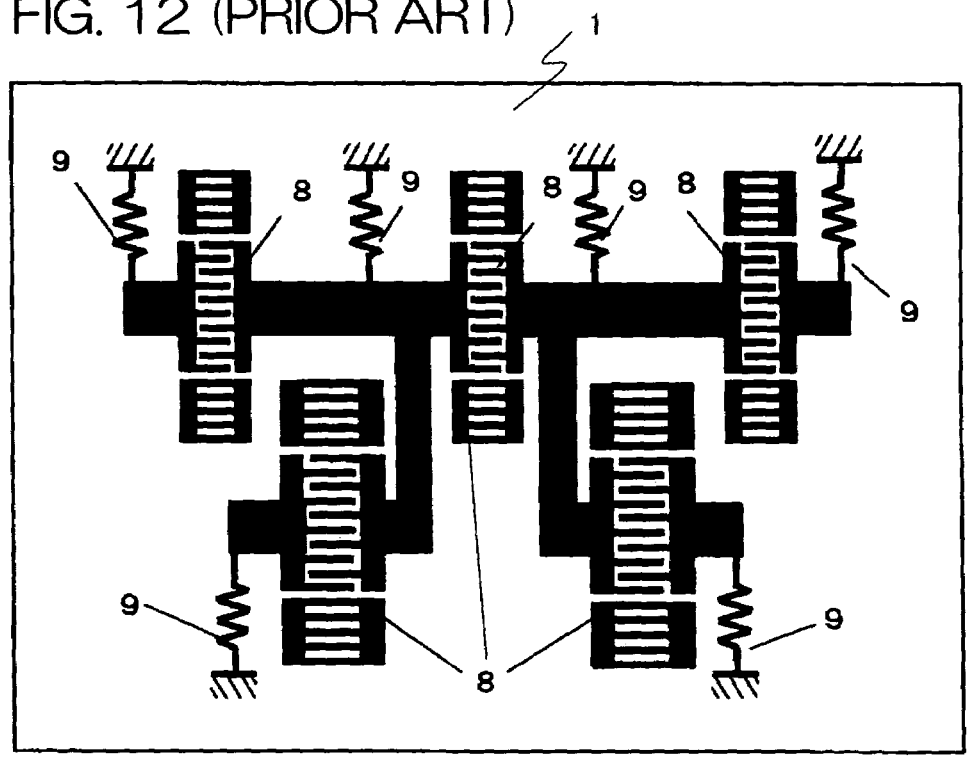
FIG. 12 is a plan view for explaining an example of an electrode structure of a conventional surface acoustic wave device.
Figure 13:
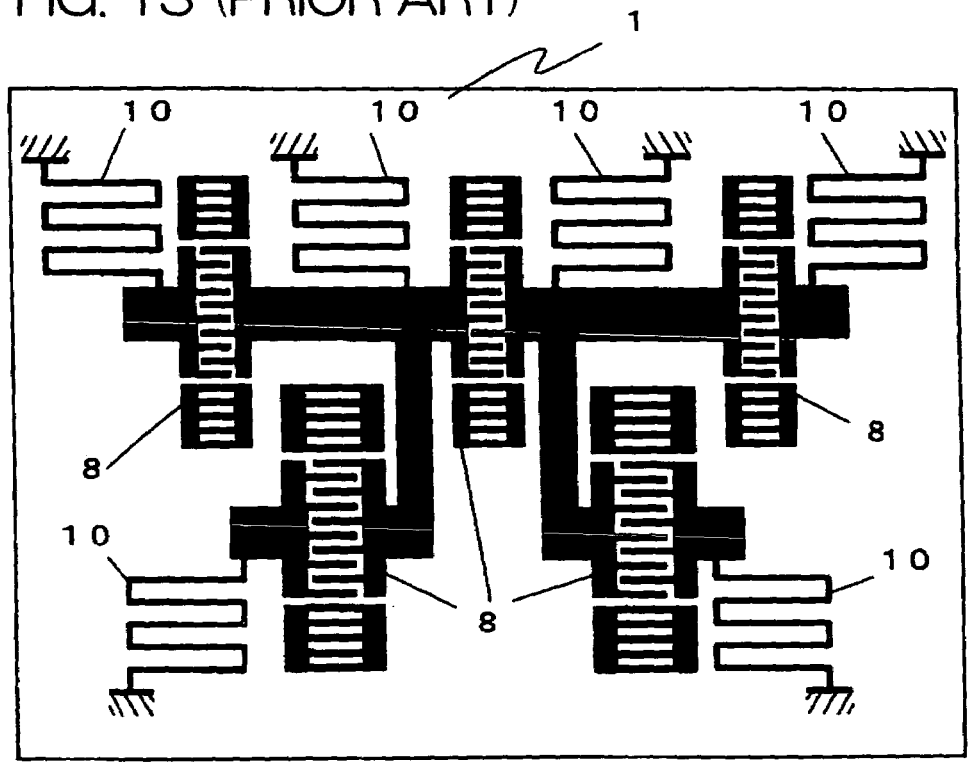
FIG. 13 is a plan view for explaining another example of an electrode structure of the conventional surface acoustic wave device.
Figure 14:
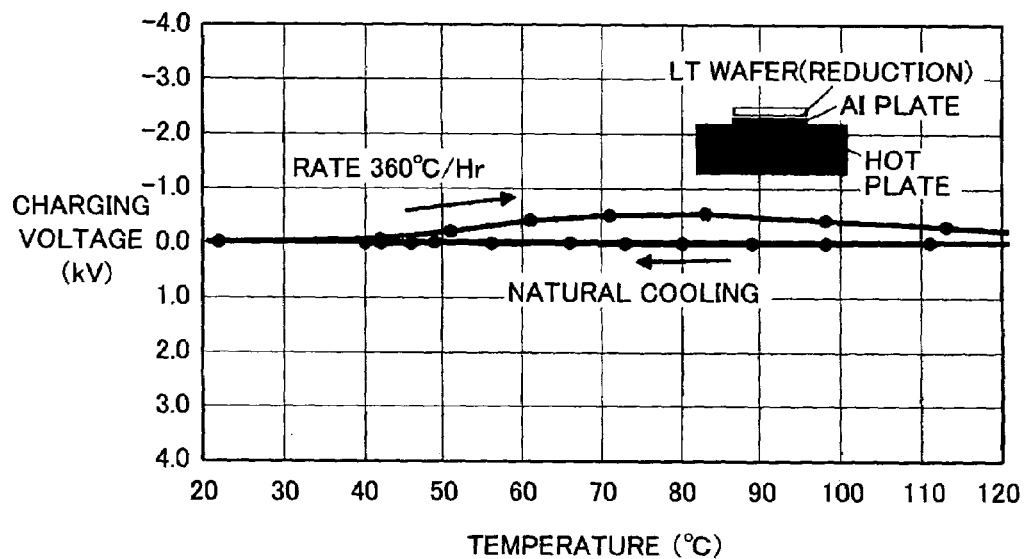
FIG. 14 is a graph showing changes in charging voltage with changes in temperature of a lithium tantalate single crystal substrate that has been subjected to reduction treatment.
Figure 15:
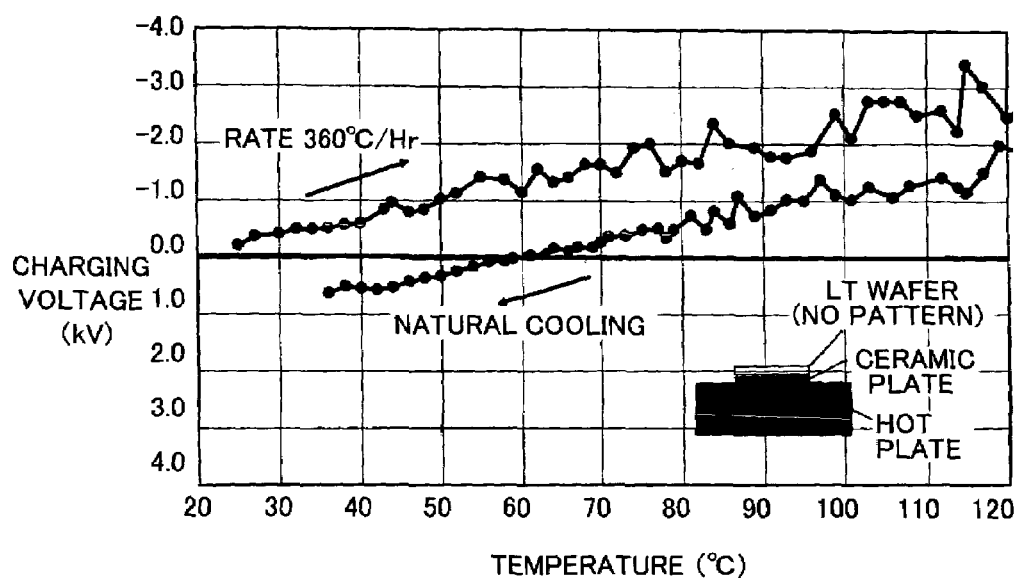
FIG. 15 is a graph showing changes in charging voltage with changes in temperature of a lithium tantalate single crystal substrate that has not been subjected to reduction treatment.

An electrode structure of the conventional vertically coupled resonator-type surface acoustic wave filter is one in which all floating electrodes on the surface acoustic wave device were connected to a ground electrode in a high-resistance pattern 9 of Si or the like, as shown in FIG. 12, the high-resistance pattern 9 was formed by RF sputtering using a sputtering target to which a small amount of boron (B) was added. The resistance value of Si to which B was added was 8 to 13 MΩ by a pad having dimensions of 40 μm by 40 μm and having a thickness of 5000 Å.

Feature measurements were then made with respect to the surface acoustic wave filter according to the present embodiment.

Here, a signal of 0 dBm was inputted, to make measurements under conditions of a frequency of 780 MHz to 960 MHz and 800 measuring points.

The number of samples was 30, and measuring equipment was Multi-Port Network Analyzer E5071A manufactured by Agilent Technologies.

When the relationship between a conductivity and a pass bandwidth was examined with respect to an example of a surface acoustic wave device obtained by subjecting the piezoelectric substrate 1 according to the present invention to reduction treatment and a comparative example having a conventional configuration, the piezoelectric substrate 1 having a higher conductivity in a range of $1\times10^{-12}$/Ωcm to $1\times10^{-10}$/Ωcm in the example of the present invention, as compared with that in the conventional configuration of the comparative example, so that it can be confirmed that pass-bandwidth characteristics were improved by the surface acoustic wave device according to the present invention at 1.1 dB.

Similarly, when the relationship between a conductivity and a minimum insertion loss was examined with respect to an example of a surface acoustic wave device according to the present invention obtained by subjecting the piezoelectric substrate 1 to reduction treatment and a comparative example having a conventional configuration, the piezoelectric substrate 1 had a higher conductivity in a range of $1\times10^{-12}$/Ωcm to $1\times10^{-10}$/Ωcm in the example of the present invention, as compared with that in the conventional configuration of the comparative example. Therefore, it could be confirmed that minimum insertion loss characteristics were improved by the surface acoustic wave device according to the present invention at 0.05 dB.

As described in the foregoing, according to the present invention, it could be confirmed that there was provided a surface acoustic wave device superior in reliability that does not cause electrode destruction by preventing charging due to a pyroelectric effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave device configured by forming an IDT electrode on a piezoelectric substrate having weak pyroelectric properties composed of a lithium tantalate single crystal or a lithium niobate single crystal, wherein
   an oxide layer having a higher oxygen content than the inside of the piezoelectric substrate is formed in a region, where the IDT electrode is formed, on a surface of the piezoelectric substrate, and
   the IDT electrode is formed on the oxide layer.

2. The surface acoustic wave device according to claim 1, wherein
   the conductivity of the oxide layer is in a range from $1\times10^{-12}$/Ωcm to $1\times10^{-10}$/Ωcm.

3. The surface acoustic wave device according to claim 1, wherein
   the oxygen content of the piezoelectric substrate having weak pyroelectric properties is lower than a stoichiometric composition ratio.

4. The surface acoustic wave device according to claim 3, wherein
   the piezoelectric substrate having weak pyroelectric properties satisfies $0<x<0.3$ where the lithium tantalate single crystal is expressed by LiTaO$_{3-x}$, or the lithium niobate single crystal is expressed by LiNbO$_{3-x}$.

5. The surface acoustic wave device according to claim 1, wherein
the piezoelectric substrate having weak pyroelectric properties is a lithium tantalate single crystal or a lithium niobate single crystal to which a transition metal element is added.

6. The surface acoustic wave device according to claim 5, wherein
the piezoelectric substrate having weak pyroelectric properties contains 2 to 3 mass % of iron as the transition metal element.

7. The surface acoustic wave device according to claim 1, wherein
the piezoelectric substrate having weak pyroelectric properties has a charging voltage of less than 1 kV.

8. The surface acoustic wave device according to claim 7, wherein
the piezoelectric substrate having weak pyroelectric properties has a charging voltage of less than 0.7 kV.

9. A surface acoustic wave device configured by forming an IDT electrode on a piezoelectric substrate having weak pyroelectric properties composed of a lithium tantalate single crystal or a lithium niobate single crystal, wherein
the oxygen content on a surface of the piezoelectric substrate in a region between electrode fingers of the IDT electrode is higher than the oxygen content on the surface of the piezoelectric substrate in a region under the electrode fingers of the IDT electrode.

10. The surface acoustic wave device according to claim 9, wherein
the oxygen content of the piezoelectric substrate having weak pyroelectric properties is lower than a stoichiometric composition ratio.

11. The surface acoustic wave device according to claim 10, wherein
the piezoelectric substrate having weak pyroelectric properties satisfies 0<x <0.3 where the lithium tantalate single crystal is expressed by LiTaO$_{3-x}$, or the lithium niobate single crystal is expressed by LiNbO$_{3-x}$.

12. The surface acoustic wave device according to claim 9, wherein
the piezoelectric substrate having weak pyroelectric properties is a lithium tantalate single crystal or a lithium niobate single crystal to which a transition metal element is added.

13. The surface acoustic wave device according to claim 12, wherein
the piezoelectric substrate having weak pyroelectric properties contains 2 to 3 mass % of iron as the transition metal element.

14. The surface acoustic wave device according to claim 9, wherein
the piezoelectric substrate having weak pyroelectric properties has a charging voltage of less than 1 kV.

15. The surface acoustic wave device according to claim 14, wherein
the piezoelectric substrate having weak pyroelectric properties has a charging voltage of less than 0.7 kV.

16. Communications equipment, comprising:
at least one of a receiving circuit and a transmission circuit having the surface acoustic wave device according to claim 1.

17. Communications equipment, comprising:
at least one of a receiving circuit and a transmission circuit having the surface acoustic wave device according to claim 9.

* * * * *